United States Patent
Gardner et al.

(10) Patent No.: US 6,222,230 B1
(45) Date of Patent: Apr. 24, 2001

(54) METHOD OF MAKING AN ELEVATED SOURCE/DRAIN WITH ENHANCED GRADED SIDEWALLS FOR TRANSISTOR SCALING INTEGRATED WITH SPACER FORMATION

(75) Inventors: Mark I. Gardner, Cedar Creek; H. Jim Fulford, Austin, both of TX (US); Charles E. May, Gresham, OR (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/204,967

(22) Filed: Dec. 3, 1998

(51) Int. Cl.[7] .......................... H01L 29/76; H01L 29/94; H01L 31/062
(52) U.S. Cl. .......................... 257/329; 257/330; 257/333
(58) Field of Search .................................. 257/329, 330, 257/333

(56) References Cited

U.S. PATENT DOCUMENTS

| 4,295,924 | 10/1981 | Garnache et al. | 156/643 |
| 4,335,450 | 6/1982 | Thomas | 365/182 |
| 5,523,600 | 6/1996 | Kapoor | 257/330 |
| 5,808,340 | 9/1998 | Wollesen et al. | 257/330 |
| 5,905,283 | 5/1999 | Kasai | 257/334 |
| 5,998,835 | * 12/1999 | Furukawa et al. | |
| 6,097,061 | * 8/2000 | Liu et al. | |

OTHER PUBLICATIONS

Stanley Wolf and Richard N. Tauber; *Silicon Processing for the VLSI Era, vol. 1—Process Technology*; pp. 531–532; 1986.

Stanley Wolf and Richard N. Tauber; *Silicon Processing for the VLSI Era, vol. 3—The Submicron MOSFET*; pp. 274–294, 307–308 and 623–633; 1995.

* cited by examiner

*Primary Examiner*—Stephen D. Meier
(74) *Attorney, Agent, or Firm*—Timothy M. Honeycutt

(57) ABSTRACT

An integrated circuit and a method of making a transistor thereof are provided. In one aspect, the integrated circuit includes a substrate and a plurality of transistors positioned on a plurality of active areas of the substrate. Each of the transistors has a doped region positioned in the substrate, an insulating layer positioned in a tapered trench in the substrate that extends through and sub-divides the doped region into a first source/drain region and a second source/drain region. The insulating layer is channel-shaped with a base, a first upwardly sloping sidewall and a second upwardly sloping sidewall. A gate electrode is positioned on the insulating layer. The channel-shaped gate dielectric layer requires less horizontal substrate area, enabling higher packing density for a given substrate. The sloped sidewalls double as spacers, enabling process simplification.

12 Claims, 3 Drawing Sheets

METHOD OF MAKING AN ELEVATED SOURCE/DRAIN WITH ENHANCED GRADED SIDEWALLS FOR TRANSISTOR SCALING INTEGRATED WITH SPACER FORMATION

BACKGROUND OF THE INVENTION

1. Field of the Invention

This invention relates generally to semiconductor processing, and more particularly to a transistor incorporating a channel-shaped gate dielectric layer, and to a method of making the same.

2. Description of the Related Art

Scaling of field effect transistor devices has historically been, and continues to be a fundamental goal in the semiconductor fabrication industry. The continual drive toward higher circuit density has been fueled by demands from ordinary consumers, industry, government and the military for ever increasing speed, capability and miniaturization of electronic products, as well as the desire of semiconductor manufacturer to reduce manufacturing costs. Scaling efforts have thus far been highly successful. Three micron processing, considered state of the art a little more than a decade ago, has given way to sub-micron processing.

As in many aspects of semiconductor processing, current scaling efforts involve a set of trade-offs between higher packing density and better performance, and short channel effects. As process technology scaled below about 2.0 µm, a series of design difficulties arose stemming from the semiconductor physics associated with short-channel devices. Hot carrier effects and subthreshold leakage currents become much more problematic in short channel devices, such as modern field effect transistors in sub-2.0 µm processing. If not compensated for through processing techniques or other means, such effects can either reduce device performance or lead to device failure or both.

One method commonly used to alleviate short-channel effects in field effect transistors is the incorporation of lightly-doped drain ("LDD") structures. The purpose of LDD structures is to absorb some of the gate-to-substrate potential into the drain of the transistor. As with many aspects of semiconductor processing, there are tradeoffs associated with the incorporation of LDD structures. LDD structures will render PMOS devices more resistance to hot carrier injection, but will also generally reduce the drive current due to a rise in the series resistance of the drain region. In addition, the formation of LDD increases fabrication complexity. At least two, and more often four separate masking steps are required for CMOS circuits. Aside from increased processing complexity, LDD structures represent a constraint on the packing density of transistors. Conventional LDD and source/drain structures extend laterally to either side of a gate electrode. Accordingly, substrate area must be set aside to accommodate for these laterally extending structures. This set aside of chip area must always be taken into account even if improvements in lithographic patterning reduce the minimum lateral feature size of devices on the substrate.

Another technique to combat short channel effects has involved the scaling of gate dielectrics. To compensate for the potentially lower drive currents for a given short channel device, conventional silicon dioxide gate oxide layers are made as thin as possible to maximize drive current. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

One potential cause of carrier injection and potential dielectric breakdown is thought to occur as a result of interface traps near the Si—$SiO_2$ interface. Interface traps are the apparent result of dangling silicon bonds at the Si—$SiO_2$ interface. Dangling Si bonds represent sites where hot carrier injection, Fowler-Nordheim tunneling and direct tunneling can occur. Although tunneling is thought to arise as a natural consequence of the quantum mechanical nature of electrons positioned near a very thin oxide layer, dangling Si bonds appear to exacerbate the problem. Independent of the exact physical cause of carrier injection, the empirical result for very thin oxides may be gate leakage currents and/or catastrophic device failure.

Another difficulty associated with very thin conventional gate oxides is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion. The potential for boron diffusion increases with decreasing oxide thickness.

The present invention is directed to overcoming or reducing the effects of one or more of the foregoing disadvantages.

SUMMARY OF THE INVENTION

In accordance with one aspect of the present invention, a method of fabricating a transistor on a substrate is provided that includes the steps of forming a doped region in the substrate and forming a tapered trench in the substrate that separates the doped region into first and second source/drain regions. The tapered trench has a bottom, a first sloped sidewall and a second and opposite sloped sidewall. A first insulating layer is formed on the bottom and first and second sloped sidewalls. A gate electrode is formed on the dielectric layer.

In accordance with another aspect of the present invention, an integrated circuit is provided that includes a substrate and a plurality of transistors positioned on a plurality of active areas of the substrate. Each of the transistors has a doped region positioned in the substrate, an insulating layer positioned in a tapered trench in the substrate that extends through and sub-divides the doped region into a first source/drain region and a second source/drain region. The insulating layer has a base, a first upwardly sloping sidewall and a second upwardly sloping sidewall. A gate electrode is positioned on the insulating layer.

In accordance with another aspect of the present invention, a transistor is provided that includes a substrate, a first source/drain region positioned in the substrate and a second source/drain region positioned in the substrate and separated from the first source/drain region by a tapered trench. A first insulating layer is positioned in the tapered trench. The first insulating layer has a base, a first upwardly sloping sidewall and a second upwardly sloping sidewall. A gate electrode is positioned on the first insulating layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
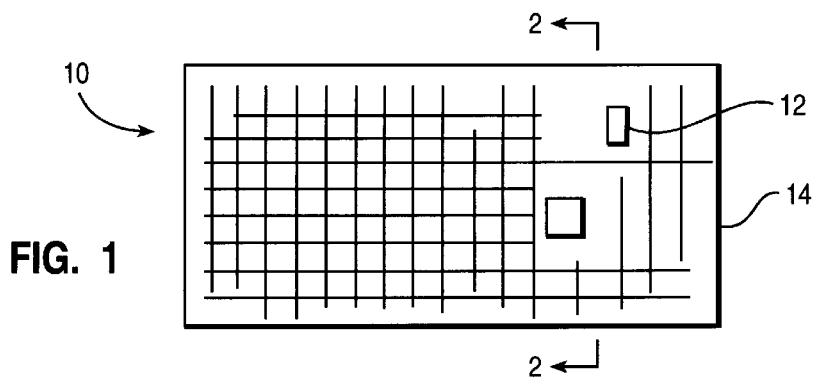
FIG. 1 is a plan view of an exemplary embodiment of an integrated circuit in accordance with the present invention.
Figure 2:
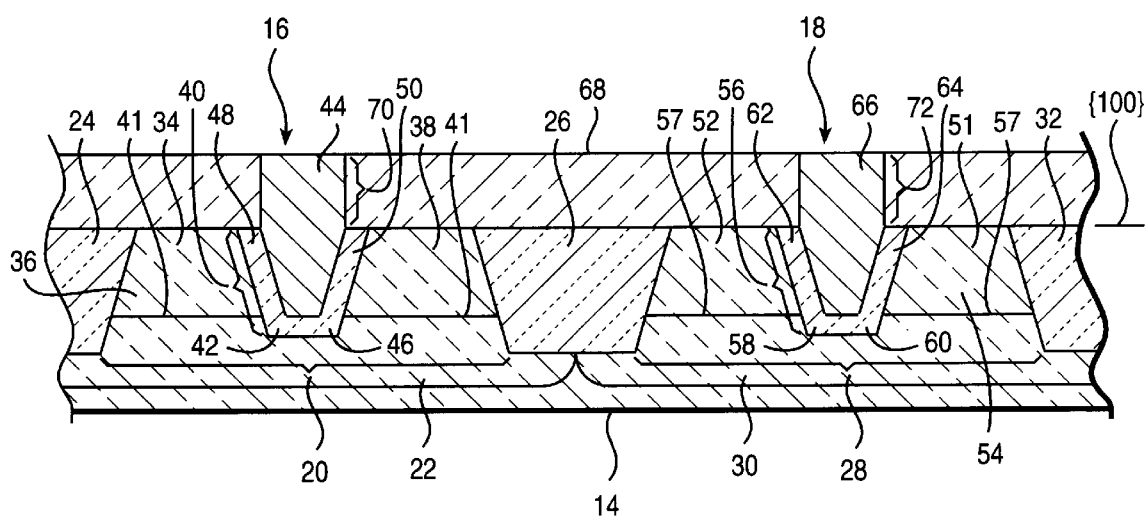
FIG. 2 is a highly magnified cross-sectional view of a small portion of the integrated circuit of FIG. 1 taken at section 2—2 in accordance with the present invention.

In the drawings described below, reference numerals are generally repeated where identical elements appear in more than one figure. Turning now to the drawings, and in particular to FIG. 1, there is shown a plan view of an exemplary embodiment of an integrated circuit 10 that includes a plurality of circuit elements 12 fabricated on a semiconductor substrate 14. The plurality of circuit elements 12 is represented schematically and consists of transistors, capacitors, and resistors, among others, interconnected to implement various logic functions. FIG. 2 is a cross-sectional view of a very small portion of FIG. 1 taken at section 2—2 as indicated. For simplicity of illustration, FIG. 2 depicts a portion of the substrate 14 and just two transistors 16 and 18 of the plurality of circuit elements 12. The semiconductor substrate 14 may be composed of n-doped, or p-doped silicon, silicon-on-insulator, or other suitable substrate materials. In an exemplary embodiment, the substrate 14 is composed of p-doped {100} monocrystalline silicon with a horizontal or {100}-plane of the substrate indicated. The transistors 16 and 18 may be n-channel, p-channel or other types of devices. The transistor 16 is formed on an active area 20 of the substrate 12 that is positioned over a well 22 formed in the substrate 14. The lateral boundaries of the active area 20 are delineated, and the transistor 16 is electrically isolated from the transistor 18 and from other structures in the substrate 14, by isolation structures 24 and 26. The transistor 18 is similarly formed on an active area 28 of the substrate 14 that is positioned over a well 30 formed in the substrate 14. The lateral boundaries of the active area 28 are delineated, and the transistor 18 is electrically isolated from the transistor 16 and from other structures in the substrate 14, by isolation structures 26 and 32.

The transistor 16 includes a doped region 34 that is segregated into source/drain regions 36 and 38 by a tapered trench 40 in the active area 20. The phrase "source/drain region(s)" is used herein to describe a region that may serve as either a source or a drain. The skilled artisan will appreciate that a source/drain region may function as a source or a drain depending upon how it is interconnected with subsequent metallization. The respective junctions of the source/drain regions 36 and 38 are designated 41. An insulating or gate dielectric layer 42 with a generally channel-shaped cross-section is formed in the trench 40 and a gate electrode 44 is formed on the gate dielectric layer 42. As used herein, the terms "formed on" or "positioned on" should be construed to include the possibility that a given layer or structure may be formed on another given layer or structure with a third or other intervening layers or structures disposed between the two. The channel-shaped cross-section of the gate dielectric layer 42 defines a base 46 and sidewalls 48 and 50 projecting obliquely upwardly therefrom. The character of the tapered trench 40 may be more clearly seen in FIGS. 6 and 7 described below.

The transistor 18 is similarly provided with a doped region 51 that is sub-divided into source/drain regions 52 and 54 by a tapered trench 56 in the active area 28. The respective junctions of the source/drain regions 52 and 54 are designated 57. A channel-shaped insulating or gate dielectric layer 58 is formed in the tapered trench 54. The channel-shaped cross-section of the gate dielectric layer 58 defines a base 60 and sidewalls 62 and 64 projecting obliquely upwardly therefrom. A gate electrode 66 is positioned on the gate dielectric layer 58.

An insulating or interlevel dielectric layer 68 is positioned on the substrate 14. The upper portions of the gate electrodes 44 and 66 project through vias 70 and 72 in the layer 68. The layer 68 serves not only as a dielectric layer, but also as a hard mask to protect the underlying active areas 20 and 28 during various processing steps described below.

Figure 3:
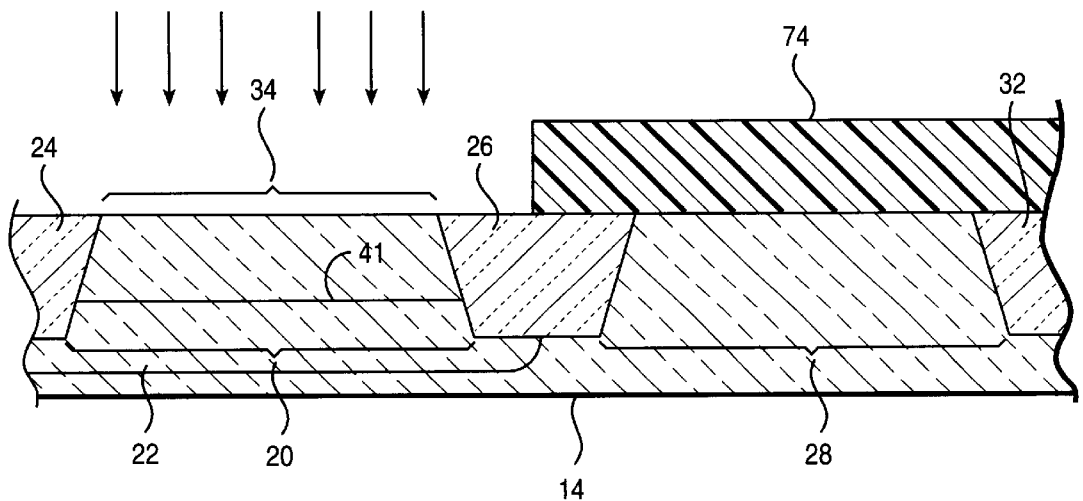
FIG. 3 is a cross-sectional view of a semiconductor substrate depicting initial definition of active areas, isolation structures and a doped region in accordance with the present invention.

An exemplary process flow for forming the transistors 16 and 18 depicted in FIG. 1 may be understood by referring now to FIGS. 3–8, and initially to FIG. 3. For simplicity of illustration, the process flow described herein in the context of the transistor 16 implemented as an n-channel device and the transistor 18 implemented as a p-channel device for CMOS logic. However, the skilled artisan will appreciate that the devices and method may be applied to other types and combinations of devices. Turning now to FIG. 2, the isolation structures 24, 26 and 32 are established in the substrate 14. The structures 24, 26 and 32 may be shallow trench isolation, field oxide, or other isolation structures. In an exemplary embodiment, the structures 24, 26 and 32 are shallow trench isolation structures planarized to the upper surface of the substrate 14 as represented by the {100}-plane, and may be composed of silicon dioxide, tetra-ethyl-ortho-silicate ("TEOS") or other suitable isolation materials and may be formed using well known damascene etching and fill techniques. The structures may have a thickness of about 2000 to 3000 Å. If desired, a liner oxide layer (not shown) of about 200 to 300 Å in thickness may be formed prior to fill by thermal oxidation. The establishment of the isolation structures 24, 26 and 32 delineates the active areas 20 and 28 of the substrate 14. The isolation structures 24, 26 and 32 are described herein as individual structures for ease of illustration. However, the skilled artisan will appreciate that the structures 24, 26 and 32 may be individual structures or constitute portions of a moat-like isolation structure surrounding the active areas 20 and 28.

The wells 22 and 30 may be twin, twin retrograde, or similar suitable wells and may be established in the substrate 14 by introducing an impurity species by ion implantation or diffusion as desired. In an exemplary embodiment, the p-well 22 is established in and beneath the active area 20 by ion implantation following the positioning of a photoresist mask 74 over the active area 28. The dosage, energy, and dopant specie are largely a matter of design discretion for the well implant. In an exemplary embodiment, boron may be implanted at about 150 to 300 KeV with a dosage of about 2E12 to 8E12 $cm^{-2}$.

With the photoresist mask 74 still in place, the doped region 34 may be established in the active area 20 by introducing an impurity species by ion implantation or diffusion as desired. In an exemplary embodiment, the doped region 34 is established by implanting a n-type dopant, such as arsenic, phosphorous or the like. For example, phosphorous may be implanted with a dosage of about 4E15 to 8E15 $cm^{-2}$ and an energy of about 50 to 150 KeV. The implant establishes a horizontal junction 41 for the doped region 34. The position of the junction 41 may shift downward during subsequent thermal steps.

Figure 4:
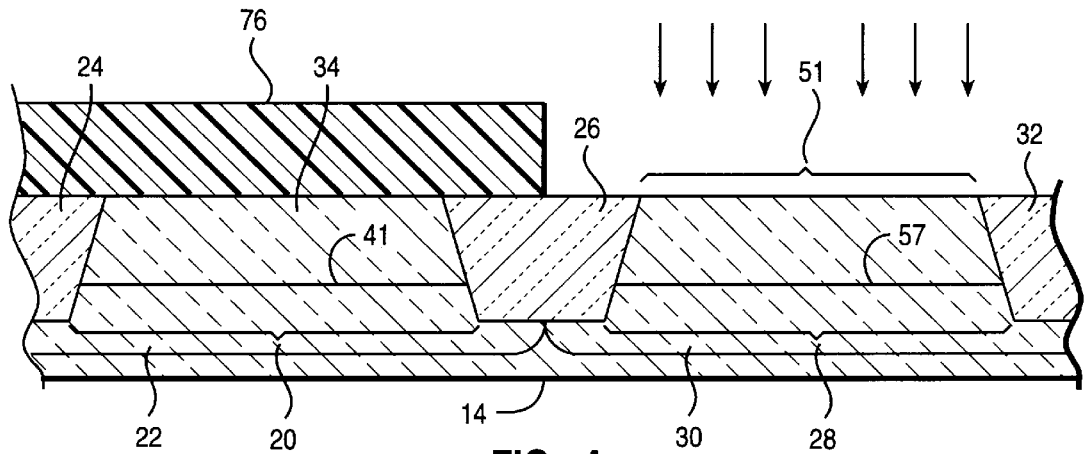
FIG. 4 is a cross-sectional view like FIG. 3 depicting formation of a second doped region in one of the active areas in accordance with the present invention.

Referring now also to FIG. 4, the photoresist mask 74 is stripped by ashing and a complimentary photoresist mask 76 is positioned over the active area 20. The n-well 30 is established by implanting a n-type impurity species, such as arsenic, phosphorous or the like. In an exemplary embodiment, phosphorous is implanted with an energy of about 400 to 600 KeV and a dosage of about 2E12 to 8E12 $cm^{-2}$.

With the mask 76 left in place, the doped region 50 may be established by introducing an impurity species by ion implantation or diffusion as desired. In an exemplary embodiment, the doped region 50 is established by implanting a p-type impurity species, such as boron, $BF_2$ or the like. For example, boron may be implanted with an energy of about 30 to 100 KeV and a dosage of about 4E15 to 8E15 $cm^{-2}$. As with the doped region 34, the implant for the doped region establishes an initial position in the substrate 14 for the horizontal junction 57.

Anneal and activation of the doped regions 34 and 50 and drive of the wells 22 and 30 may be by subsequent high temperature steps than occur later in the process flow, such as, interlevel dielectric layer deposition and reflow. Alternatively, a dedicated anneal step may be performed at this point. For example, the substrate 14 may be subjected to a rapid thermal anneal ("RTA") at about 800 to 1050° C. for about 10 to 90 seconds. An exemplary desired depth range for the junctions 41 and 57, whether established by a dedicated anneal step or through subsequent high temperature thermal steps, is about 0.05 to 0.2, μm. The skilled artisan will appreciate that the parameters for the well implants and the anneal process will depend on the initial doping level of the substrate, and the design rules for the fabrication process used.

Figure 5:
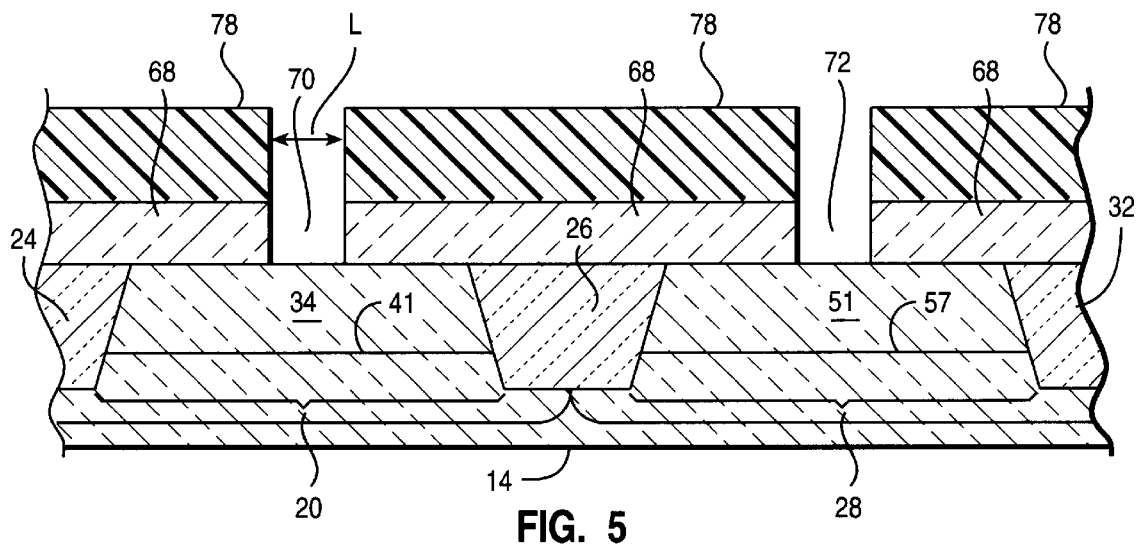
FIG. 5 is a cross-sectional view like FIG. 4 depicting formation and patterning of an interlevel dielectric layer in accordance with the present invention.

Referring now to FIGS. 4 and 5, the photoresist mask 76 is stripped by ashing and the dielectric layer 68 is formed on the substrate 14. As noted above, the dielectric layer 68 is intended to protect the underlying active areas 20 and 28 during subsequent etching and polishing steps. In addition, and as described more fully below, the dielectric layer will act as spacer extensions. Exemplary materials include silicon dioxide, silicon nitride, silicon oxynitride or the like. In an exemplary embodiment, silicon dioxide is deposited to a thickness of about 500 to 1500 Å using chemical vapor deposition ("CVD"). A photoresist mask 78 is patterned on the dielectric layer 68 and anisotropic etch is performed to establish vias 70 and 72 through the dielectric layer 68 to the substrate 14. The etch may be by reactive ion etching, chemical plasma etching or other suitable anisotropic etching techniques. The etch chemistry should be selective to the underlying silicon substrate 14. For example, $CF_4/H_2$ may be used. The lateral dimension L of the vias 70 and 72 may be the minimum feature size available using the prevailing lithographic patterning system or some dimension other than the minimum feature size.

Figure 6:
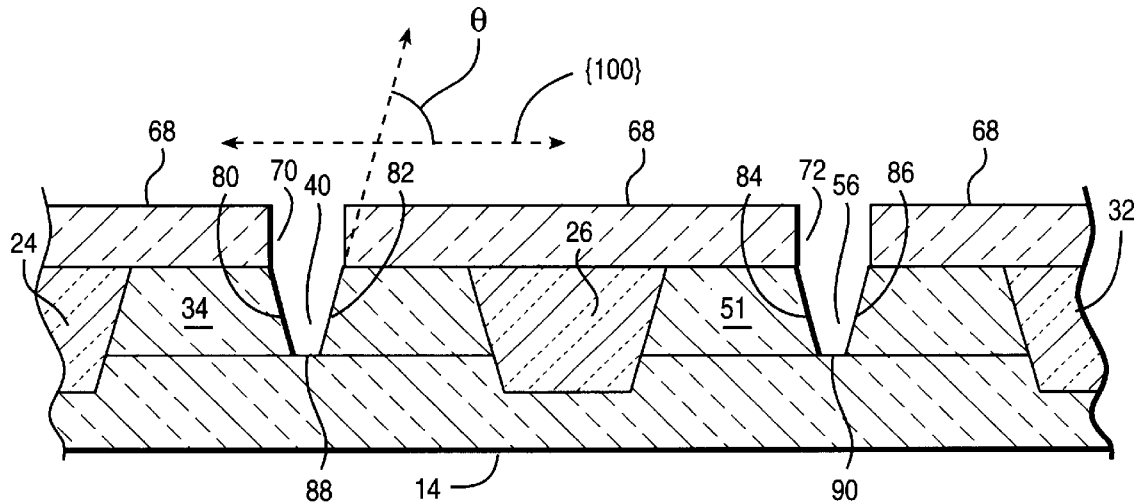
FIG. 6 is a cross-sectional view like FIG. 5 depicting formation of tapered trenches in the active areas of the substrate in accordance with the present invention.

Referring now to FIGS. 5 and 6, the photoresist mask 78 is stripped by ashing and the tapered trenches 40 and 56 are formed in the active areas 20 and 28 of the substrate 14. The tapered trench 40 includes sloped sidewalls 80 and 82 and the tapered trench 56 includes corresponding sloped sidewalls 84 and 86. The slope of the sidewalls 80, 82, 84 and 86 is given by the angle θ, which is the angle between a given sidewall 80, 82, 84 or 86, and the {100}-plane of the substrate 14 as shown in FIG. 6. The magnitude of the angle θ will depend upon the process used to form the tapered trenches 40 and 56 as described more fully below.

The tapered trenches 40 and 56 are advantageously formed by wet directional etching, or by dry directional etching with or without plasma or reactive ion enhancement. In an exemplary embodiment of the process of the present invention, the tapered trenches 40 and 56 are advantageously fabricated using a reactive ion directional dry etch process utilizing a mixture of one or more etchant species and one or more diluting species. In this exemplary embodiment, the etch ambient consists of an initial mixture of about 90 wt % $SF_6$ and about 10 wt % He. This initial mixture etches with a relatively high degree of anisotropicity. However, the concentration of $SF_6$ is decreased to about 10 wt % and the concentration of He increased to about 50 wt % over a time interval, T, to yield the sloped sidewalls 80, 82, 84 and 86 with a slope angle θ of about 60°. The value of the time interval T is a function of the desired depth of the tapered trenches 40 and 56. In this illustration, the etch is carried out with an interval T of about 80 seconds to yield tapered trenches 40 and 56 with a depth of about 600 to 900 Å. The tapered trenches 40 and 56 should be etched through the junctions 41 and 57 so that the doped regions 34 and 50 are subdivided, respectively, into the source/drain regions 36 and 38, and 52 and 54. Accordingly, the total etch duration should be tailored to etch at least to the junctions 41 and 57.

In order to establish relatively uniformly sloped sidewalls 80, 82, 84 and 86, the tine interval T is subdivided into several equal sub-intervals, $t_0, t_1 \ldots t_8$, and the concentrations of the etchant constituents are changed at the end of each sub-interval. The following table summarizes the variations in concentrations relative to time:

| Time (s) | $SF_6$ Concentration (wt %) | He Concentration (wt %) |
|---|---|---|
| $t_0 = 0$ | 90 | 10 |
| $t_1 = 10$ | 80 | 15 |
| $t_2 = 20$ | 70 | 20 |
| $t_3 = 30$ | 60 | 25 |
| $t_4 = 40$ | 50 | 30 |
| $t_5 = 50$ | 40 | 35 |
| $t_6 = 60$ | 30 | 40 |
| $t_7 = 70$ | 20 | 45 |
| $t_8 = 80$ | 10 | 50 |

The total interval, T, as well as the number of sub-intervals are largely a matter of design discretion. However, the smoothness of the sidewalls 80, 82, 84 and 86 will generally increase if the number of sub-intervals is increased.

If more highly sloped sidewalls 80, 82, 84 and 86 are desired, the concentration of the diluting species, in this case He, is not ramped as high during the etch. For example, the He concentration may be increased from an initial value of about 10 wt % to only about 30 wt % during the interval T to yield a slope angle θ of about 75°. Conversely, if a more shallow slope is desired, the He concentration is started higher, at about 30 wt % for example, and then ramped higher over the time interval T to yield a slope angle θ of about 25°. In general the concentration of $SF_6$ may be decreased from about 90 wt % to between about 90 and 10 wt % and the concentration of the He being increased from about 10 wt % to between about 10 to 90 wt %. In this way, the slope angle θ may be easily tailored between about 10° and about 80° as desired.

The etch yields the tapered trenches 40 and 56 with substantially flat trench bottoms 88 and 90. As described more fully below in conjunction with the description of the formation of the gate dielectric layers 42 and 58 (see FIG. 1) the substantially flat trench bottoms 88 and 90 aid in the formation of the gate dielectric layers 42 and 58 with smaller thicknesses in the vicinities of the trench bottoms 88 and 90 and relatively larger thicknesses adjacent to the sidewalls 80, 82, 84 and 86.

Alternatively, the tapered trenches 40 and 56 may be formed using a wet etch with an etchant that exhibits orientation-dependent etching properties. In this regard, the substrate 14 may be etched using a mixture of about 24 wt % KOH, about 13 wt % isopropyl alcohol and about 63 wt % $H_2O$. This etchant mixture exhibits a much higher etch rate along {100}-planes than along {111}-planes and yields a tapered trench with an angle θ approximately equal to 54.7°. The 54.7° angle results from the sidewalls 80, 82, 84 and 86 being themselves {111}-planes. As with the aforementioned dry etch process, the substrate 14 is exposed to the wet etchant solution until the tapered trenches 40 and 56 are formed with substantially flat trench bottoms 88 and 90.

Implants to adjust threshold voltage and to prevent punch-through may be performed through the dielectric layer 68. The threshold voltage control and punchthrough prevention implants may be performed using a p-type dopant, such as boron. The threshold voltage implant may be performed with a dosage of about 2E12 to 8E12 $cm^{-2}$ and an energy of about 2 to 20 keV. The punchthrough implant may be performed with a dosage of about 4E12 to 9E12 $cm^{-2}$ and an energy of about 30 to 150 keV.

Figure 7:
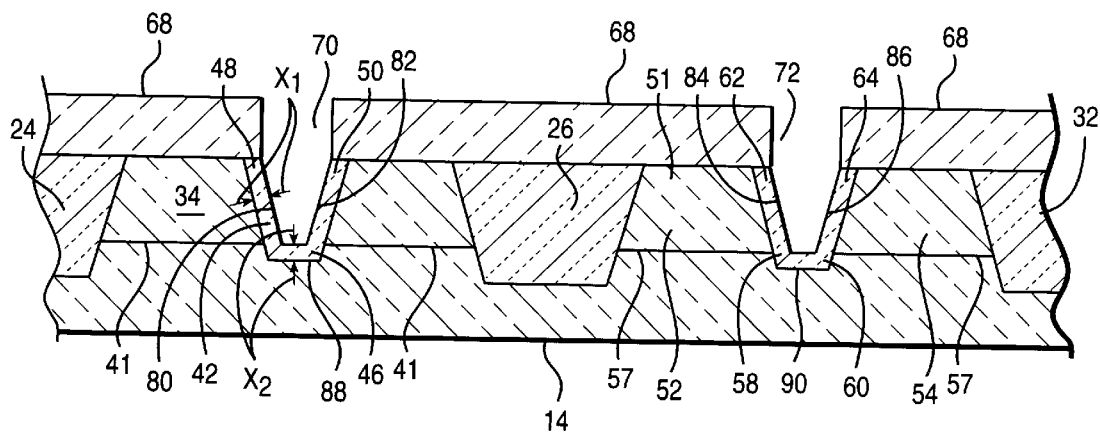
FIG. 7 is a cross-sectional view like FIG. 6 depicting formation of gate dielectric layers in tapered trenches in accordance with the present invention.

The fabrication of the gate dielectric layers 42 and 58 may be understood by referring now to FIG. 7. Initially, the sidewalls 80, 82, 84 and 86 and bottoms 88 and 90 are RCA cleaned. The gate dielectric layers 42 and 58 may be composed of a variety of suitable gate dielectric materials, such as silicon dioxide, $Ta_2O_5$, silicon nitride, or the like, and may be composites of these. For example, a $SiO_2$ layer may be deposited or grown first and covered with a CVD $Si_3N_4$ layer. Thermal oxidation, CVD or like techniques may be used. In an exemplary embodiment, the gate dielectric layers 42 and 58 are composed of silicon dioxide formed by thermal oxidation by exposing the channel 62 to an oxygen containing ambient at about 850 to 1000 ° C. for about 10 to 60 seconds in an RTA process or via a furnace process for about 2 to 10 minutes at about 750 to 950 ° C. A furnace process will yield slightly thicker gate dielectric layers 42 and 58. A nitrogen bearing species may be incorporated into the thermal oxidation step to form the gate dielectric layers 42 and 58 to strengthen the gate dielectric layers 42 and 58 against hot carrier injection. The exemplary nitrogen bearing species may be, for example, NO, $N_2O$, $NH_3$, or the like, or mixtures thereof.

As a result of the sloped sidewalls 80, 82, 84 and 86 of the tapered trenches 40 and 56 and the double-diamond lattice structure of the silicon substrate 14, the oxidation rate of the silicon lining the tapered trenches 40 and 56 will be orientation-dependent. As the atomic density of the substrate 14 is lower in the {100}-planes than in planes normal or oblique to the {100}-planes, the oxidation rate of the trench bottoms 88 and 90 will be lower than the oxidation rate of the sidewalls 80, 82, 84 and 86. The differential oxidation rates result in the formation of the sidewalls 48 and 50 of the gate dielectric layer 42 and 62 and 64 of the gate dielectric layer 58 with a thickness $X_1$ that is appreciably larger than the thickness $X_2$ of the bases 46 and 60. The thickness $X_1$ of each sidewall 48, 50, 62 and 64 will usually be about the same, but may vary slightly due to surface nonuniformities in the sidewalls 80, 82, 84 and 86 and variations in the oxidation process. In an exemplary embodiment, the gate dielectric layers 42 and 58 may have a thickness of about 10 to 15 Å at the bases 46 and 60 and about 15 to 25 Å for the sidewalls 48, 50, 62 and 64. Thus, the layers 42 and 58 are formed with thin bases 46 and 60 that can yield potentially high, and thus desirable gate-to-substrate capacitances, and with relatively thicker sidewalls 48, 50, 62 and 64 that protect the later-formed gate electrodes 44 and 66 (See FIG. 1) from hot-carriers and provide acceptably low levels of gate-to-source/drain overlap capacitances.

The skilled artisan will appreciate that the sidewalls 48, 50, 62 and 64 of the insulating layers 42 and 58 serve as both gate dielectrics and sidewall spacers. If the dielectric layer 68 is incorporated into the process flow, the portions of the dielectric layer 68 overlying the sidewalls 48, 50, 62 and 64 thus function as spacer extensions to fully insulate the sidewalls of the gate electrodes 44 and 66. Process is simplified through the elimination of the separate masking, deposition or oxidation and etching steps required for conventional spacer definition.

A nitrogen bearing species may be incorporated into the thermal oxidation step to form the gate dielectric layer 42 to strengthen the gate dielectric layer 42 against hot carrier injection. The exemplary nitrogen bearing species may be, for example, NO, $N_2O$, $NH_3$, or the like, or mixtures thereof.

Figure 8:
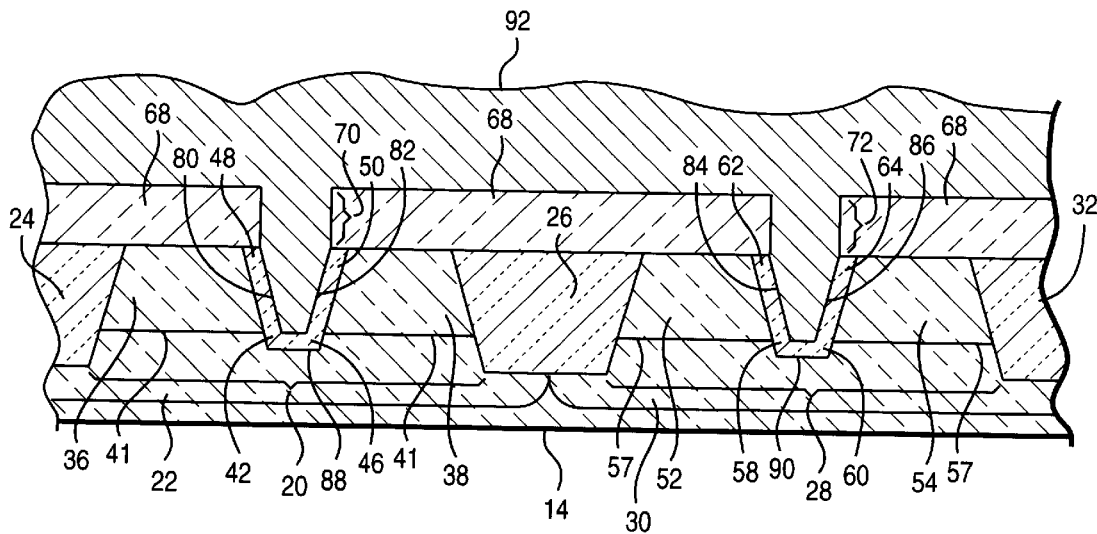
FIG. 8 is a cross-sectional view like FIG. 7 depicting deposition of a conductor layer on the gate dielectric layers in accordance with the present invention.

The fabrication of the gate electrode 36 may be understood by referring now to FIGS. 1 and 8. As shown in FIG. 8, a layer 92 of conducting material is blanket deposited over the dielectric layer 68, covering the gate dielectric layer 42 and 58 and filling the vias 70 and 72. The conductor layer 92 is subsequently planarized to the dielectric layer 68 as shown in FIG. 1 to yield the completed gate electrodes 44 and 66. A variety of conducting materials may be used for the conducting layer 70 such as tungsten, tantalum, aluminum, titanium, polysilicon with subsequent doping, or the like. Low temperature materials may be used as the anneal of the source/drain regions 36, 38, 52 and 54 may be performed in advance of the deposition and planarization of the conductor layer 92. In an exemplary embodiment, the conductor layer 92 is composed of aluminum, pure or alloyed and may be deposited by sputter, jet vapor or the like. The planarization of the conductor layer 92 to yield the gate electrode 36 may be by etch back planarization, chemical mechanical polishing ("CMP") or the like, and is advantageously done via CMP. The gate electrodes 44 and 66 conform to the shapes of the gate dielectric layers 42 and 58, and thus presents a generally tapered cross-section.

As the skilled artisan will appreciate, the transistors 16 and 18 include overlapping gate and source/drain features.

However, as noted above, the process in accordance with the present invention establishes the gate dielectric layers 42 and 58 with relatively thicker sidewalls 48, 50, 62 and 64 that serve to reduce the impact of any overlap capacitances as well as punchthrough and tunneling effects while the relatively thinner portions at the bases 88 and 90 provide very thin gate dielectric layers in the channel regions beneath the gate electrodes 44 and 66, thereby reducing the requisite threshold voltages for the transistors 16 and 18 and enhancing the performance thereof. The tapered shape of the gate dielectric layers 42 and 58 enable the overall lateral dimensions of the transistors 16 and 18 to be shrunk and thus provide for much tighter packing density on the substrate 14. In addition, the sloping sidewalls 48, 50, 62 and 64 double as dielectric spacers. Thus formation of the insulating layers 42 and 58 and spacer formation are integrated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An integrated circuit, comprising:

a substrate; and a plurality of transistors positioned on a plurality of active areas of the substrate, each of the transistors hang a doped region positioned in the substrate, a first insulating layer positioned in a tapered trench in the substrate that extends through and sub-divides the doped region into a first source/drain region and a second source/drain region, the first insulating layer having a base, a first upwardly sloping sidewall having a first upper surface and a second upwardly sloping sidewall having a upper surface, a gate electrode positioned on the insulating layer and having first and second side surfaces projecting above the substrate, and a second insulating layer positioned on the substrate adjacent to the first and second side surfaces of the gate electrode and covering the first and second upper surfaces of the first insulating layer.

2. The integrated circuit of claim 1, wherein the substrate has a horizontal plane, the first and second sidewalls projecting upwardly at an angle of about 10° to 80° with respect to the horizontal plane.

3. The integrated circuit of claim 1, wherein the base has a first thickness, the first upwardly projecting sidewall has a second thickness and the second upwardly projecting has a third thickness, the second and third thicknesses being larger than the first thickness.

4. The integrated circuit of claim 1, wherein the first insulating layer comprises silicon dioxide.

5. The integrated circuit of claim 1, wherein the first insulating layer comprises a first layer of insulating material positioned on a second layer of insulating material.

6. The integrated circuit of claim 1, wherein the second insulating layer has an upper surface that is substantially planar with the gate electrode.

7. A transistor, comprising:

a substrate;

a first source/drain region positioned in the substrate and a second source/drain region positioned in the substrate and separated from the first source/drain region by a tapered trench;

a first insulating layer positioned in the tapered trench, the first insulating layer having a base, a first upwardly sloping sidewall having a first upper surface and a second upwardly sloping sidewall having a second upper surface;

a gate electrode positioned on the first insulating layer and having first and second side surfaces projecting above the substrate; and a second insulating layer positioned on the substrate adjacent to the first and second side surfaces of the gate electrode and covering the first and second upper surfaces of the first insulating layer.

8. The transistor of claim 7, wherein the substrate has a horizontal plane, the first and second sidewalls projecting upwardly at an angle of about 10° to 80° with respect to the horizontal plane.

9. The transistor of claim 7, wherein the base has a first thickness, the first upwardly projecting sidewall has a second thickness and the second upwardly projecting sidewall has a third thickness, the second and third thicknesses being larger than the first thickness.

10. The transistor of claim 7, wherein the first insulating layer comprises silicon dioxide.

11. The transistor of claim 7, wherein the first insulating layer comprises a first layer of insulating material positioned on a second layer of insulating material.

12. The transistor of claim 7, wherein the second insulating layer has an upper surface that is substantially planar with the gate electrode.

* * * * *

UNITED STATES PATENT AND TRADEMARK OFFICE
CERTIFICATE OF CORRECTION

PATENT NO. : 6,222,230 B1
DATED : April 24, 2001
INVENTOR(S) : Mark I. Gardner et al.

It is certified that error appears in the above-identified patent and that said Letters Patent is hereby corrected as shown below:

Claim 1,
Delete the word "hang" and substitute the word -- having -- therefor;
Line 38, insert the word -- second -- between the words "a" and "upper"; and Claim 12,
Insert the word -- sidewall -- after the phrase "second upwardly projecting".

Signed and Sealed this

Thirteenth Day of November, 2001

Attest:

NICHOLAS P. GODICI
Attesting Officer
Acting Director of the United States Patent and Trademark Office